(12) United States Patent
Ma et al.

(10) Patent No.: US 8,723,522 B2
(45) Date of Patent: May 13, 2014

(54) SUPERCONDUCTOR RF COIL ARRAY

(75) Inventors: Qiyuan Ma, Milburn, NJ (US); Erzhen Gao, Milburn, NJ (US)

(73) Assignee: Time Medical Holdings Company Limited, George Town (KY)

( * ) Notice: Subject to any disclaimer, the term of this patent is extended or adjusted under 35 U.S.C. 154(b) by 397 days.

(21) Appl. No.: 12/887,474

(22) Filed: Sep. 21, 2010

(65) Prior Publication Data

US 2011/0121830 A1 May 26, 2011

Related U.S. Application Data

(60) Provisional application No. 61/244,132, filed on Sep. 21, 2009.

(51) Int. Cl.
*G01V 3/00* (2006.01)

(52) U.S. Cl.
USPC .......................................... 324/318

(58) Field of Classification Search
USPC .................................. 324/300–322
See application file for complete search history.

(56) References Cited

U.S. PATENT DOCUMENTS

| | | | |
|---|---|---|---|
| 6,169,399 B1 * | 1/2001 | Zhang et al. ................ | 324/318 |
| 6,377,836 B1 | 4/2002 | Arakawa et al. | |
| 7,138,801 B2 * | 11/2006 | Yamamoto et al. ........... | 324/318 |
| 7,173,424 B2 * | 2/2007 | Saitoh et al. ................. | 324/318 |
| 7,728,592 B2 * | 6/2010 | Ma et al. ...................... | 324/318 |
| 7,772,842 B2 * | 8/2010 | Gao et al. .................... | 324/307 |
| 7,859,264 B2 * | 12/2010 | Wosik et al. ................. | 324/318 |
| 8,106,656 B2 * | 1/2012 | Wosik et al. ................. | 324/318 |
| 2006/0033498 A1 | 2/2006 | Saitoh et al. | |
| 2007/0273379 A1 | 11/2007 | Hasegawa et al. | |
| 2008/0111548 A1 | 5/2008 | Yamamoto et al. | |
| 2009/0134873 A1 | 5/2009 | Cho et al. | |

FOREIGN PATENT DOCUMENTS

| | | |
|---|---|---|
| WO | WO-2004038431 A2 | 5/2004 |
| WO | WO-2004086074 A1 | 10/2004 |
| WO | WO-2005052621 A1 | 6/2005 |

OTHER PUBLICATIONS

Jean-Christophe Ginefri et al., "Technical aspects: Development, manufacture and installation of a cryo-cooled HTS coil system for high-resolution in-vivo imaging of the mouse at 1.5 T," Methods, Aug. 23, 2007, pp. 54-67, vol. 43, Issue 1.

(Continued)

*Primary Examiner* — Dixomara Vargas
(74) *Attorney, Agent, or Firm* — Frommer Lawrence & Haug LLP

(57) ABSTRACT

A superconducting RF coil array which may be used in whole body MRI scanners and/or in dedicated MRI systems. Some embodiments provide a superconducting RF coil array for at least one of receiving signals from and transmitting signals to a sample during magnetic resonance analysis of the sample, the superconducting RF coil array comprising a thermally conductive member configured to be cryogenically cooled, and a plurality of coils elements comprising superconducting material, wherein each coil element is thermally coupled to the thermally conductive member and is configured for at least one of (i) receiving a magnetic resonance signal from a spatial region that is contiguous with and/or overlaps a spatial region from which at least one other of the plurality of coil elements is configured to receive a signal and (ii) transmitting a radiofrequency signal to a spatial region that is contiguous with and/or overlaps a spatial region to which at least one other of the plurality coil elements is configured to transmit a radiofrequency signal.

28 Claims, 11 Drawing Sheets

(56) References Cited

OTHER PUBLICATIONS

M.S. Chow et al., "A Two-Channel HTS Thin-Film Phases Array Coil for Low Field MRI," Int'l Society for Magnetic Resonance in Medicine, Scientific Meeting and Exhibition, Proceedings, Int'l Society for Magnetic Resonance in Medicine, US, Jul. 10, 2003, p. 2372.

PCT International Search Report mailed Jan. 28, 2011 in International Application No. PCT/US2010/049719, filed Sep. 21, 2010.
International Preliminary Report on Patentability mailed Mar. 27, 2012 in International Application No. PCT/US2010/049719, filed Sep. 21, 2010.

* cited by examiner

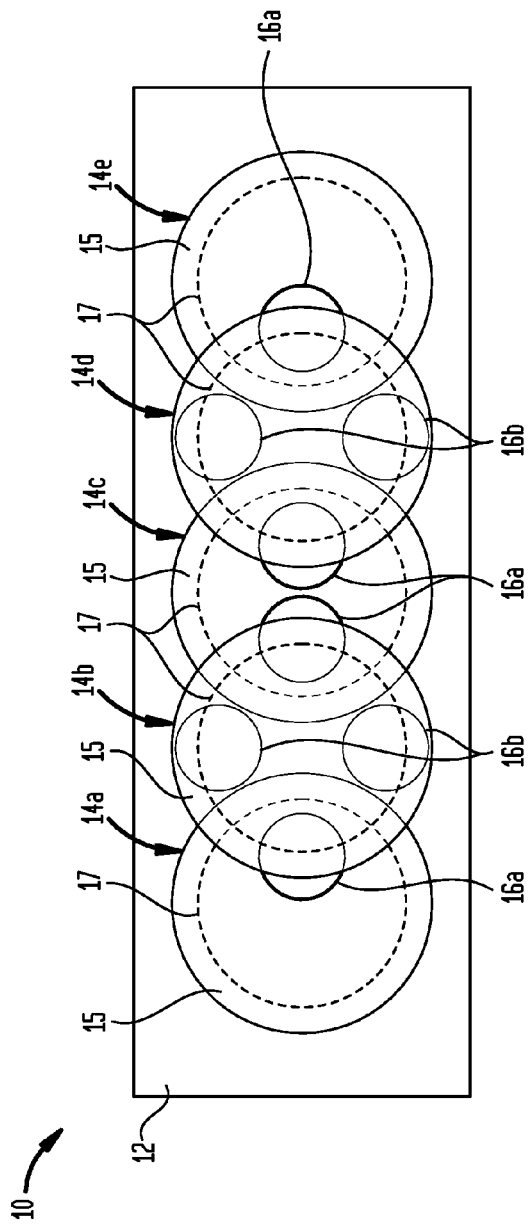
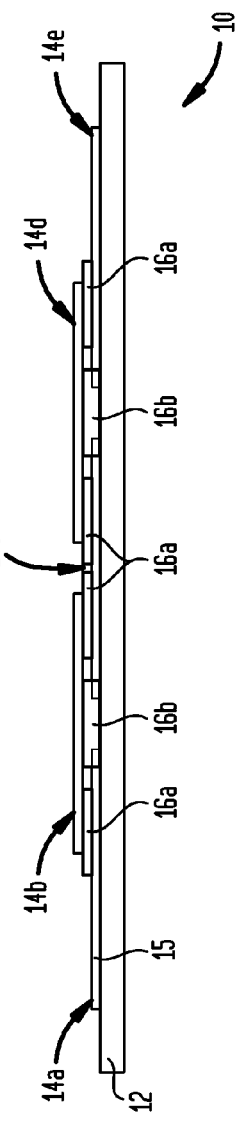
FIG. 1A
FIG. 1B

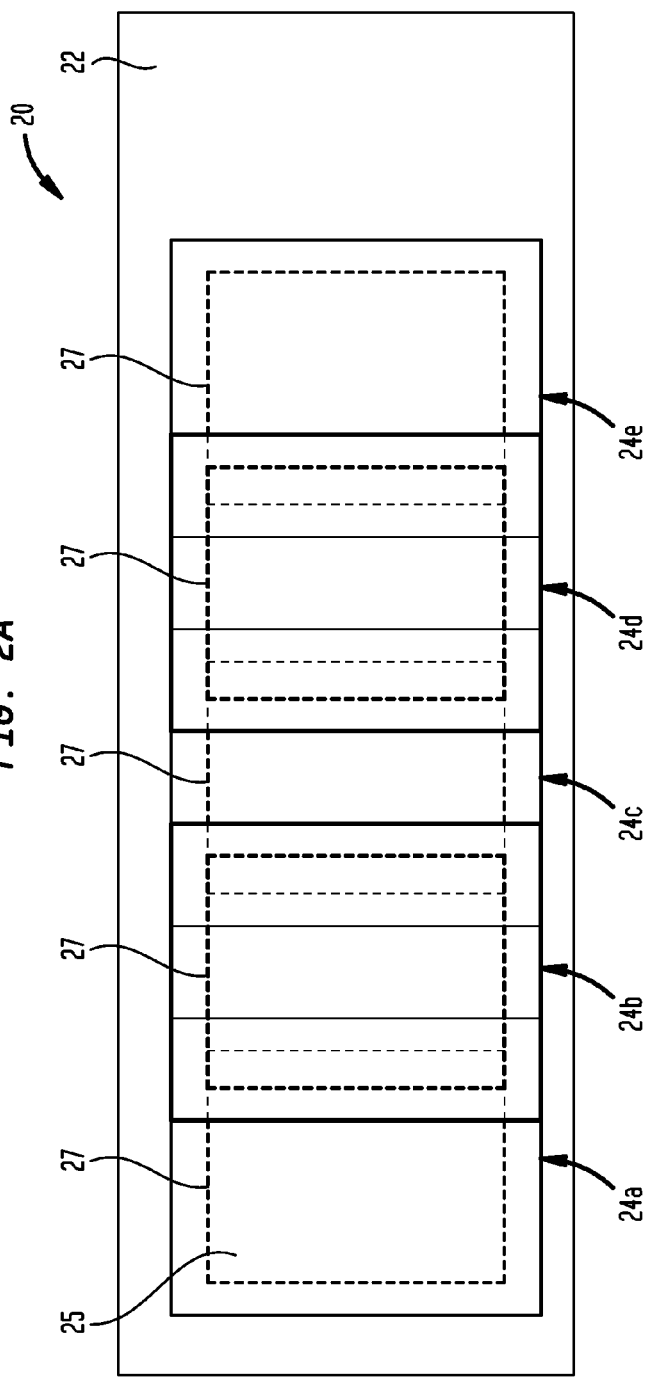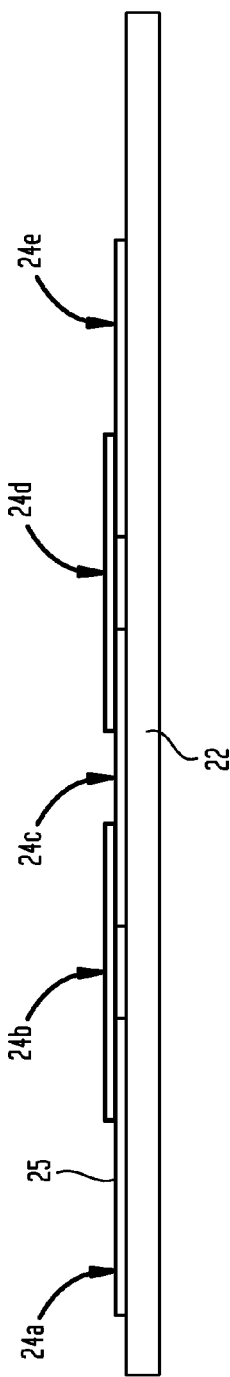

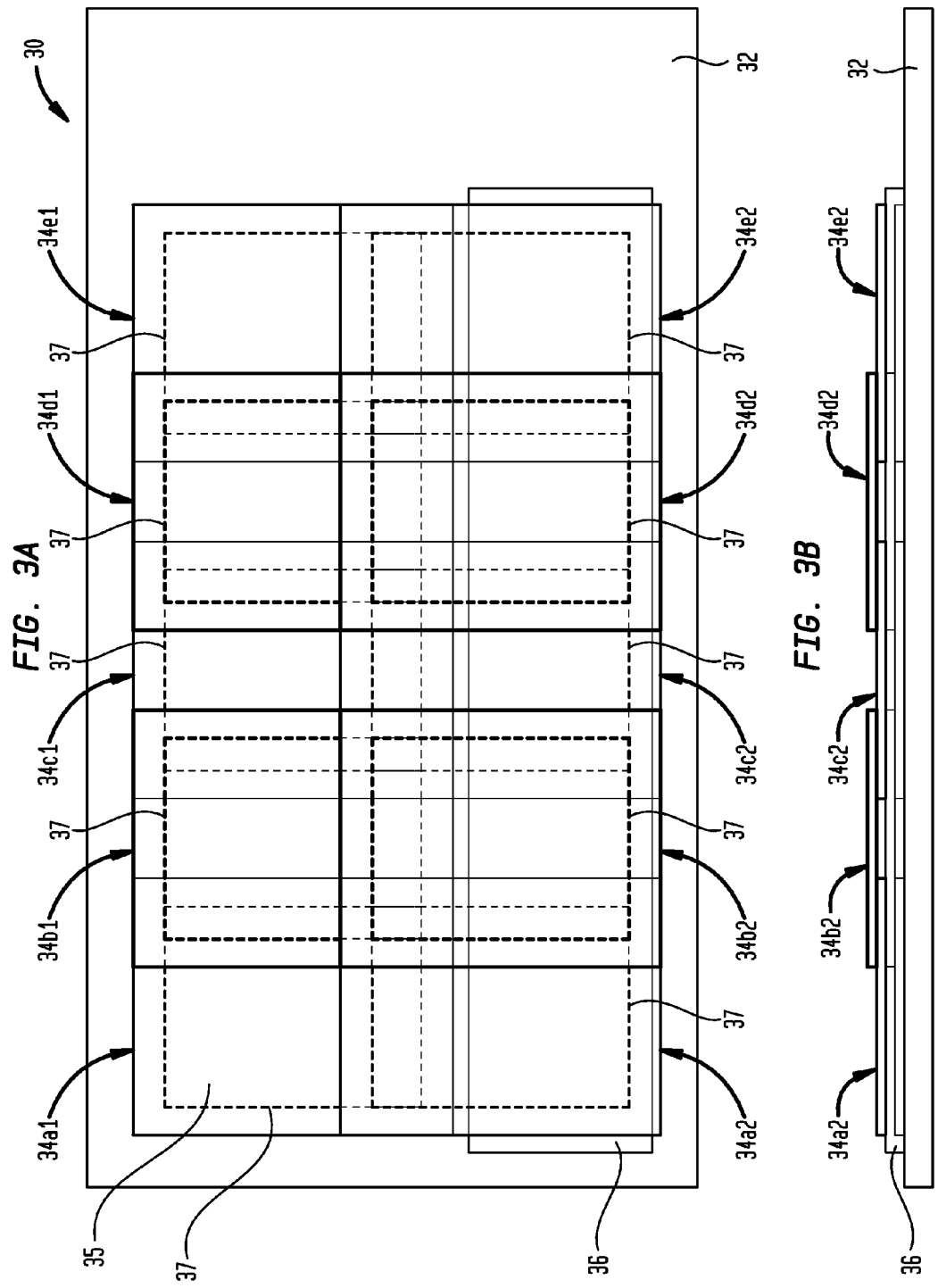

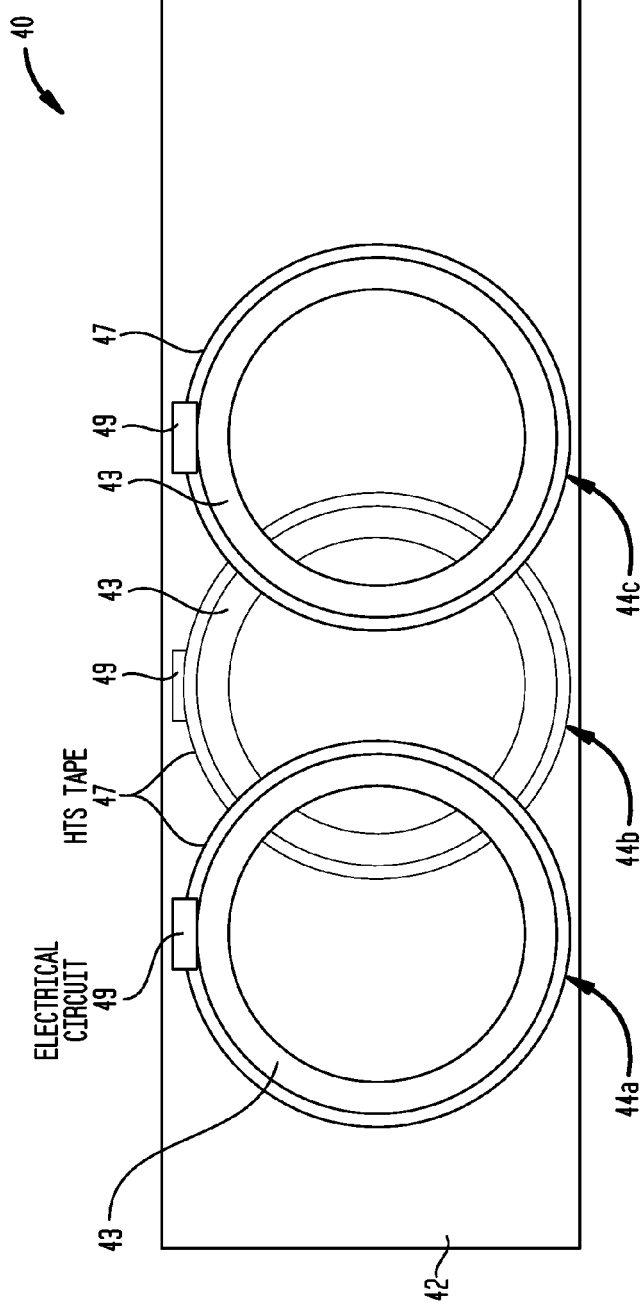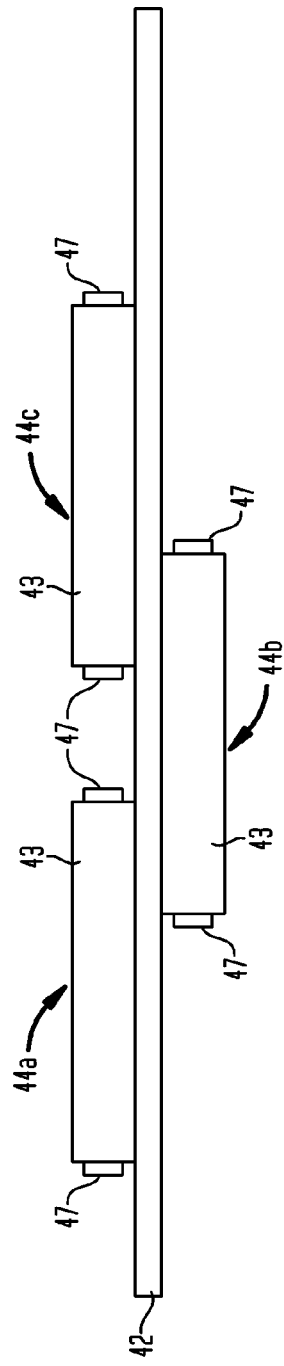
FIG. 4A
FIG. 4B

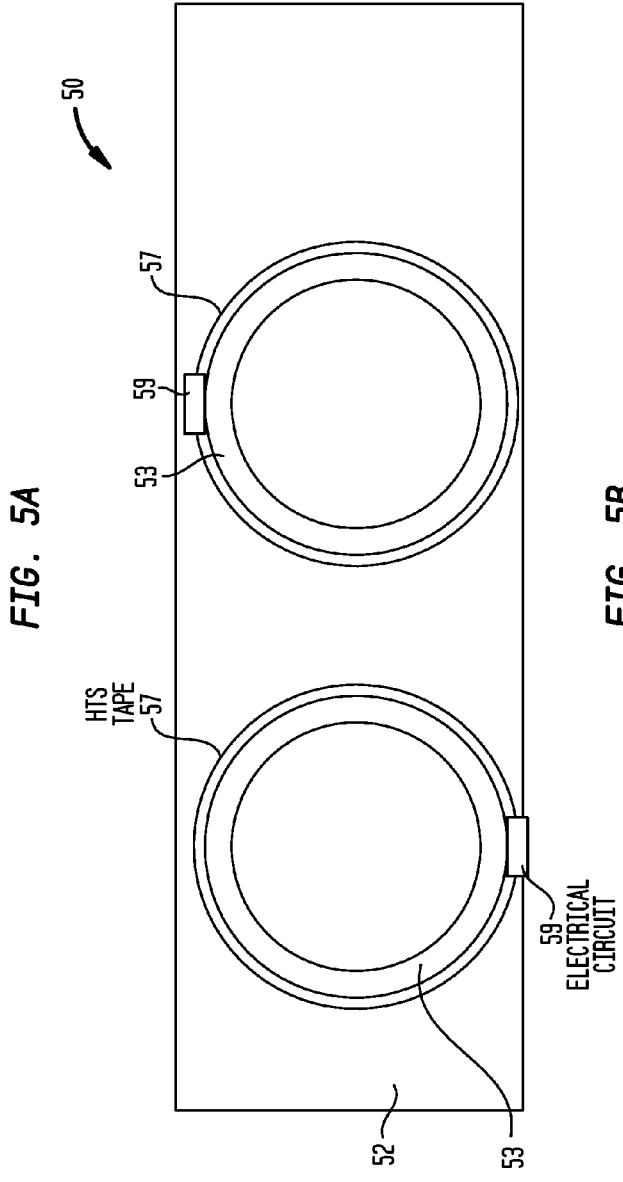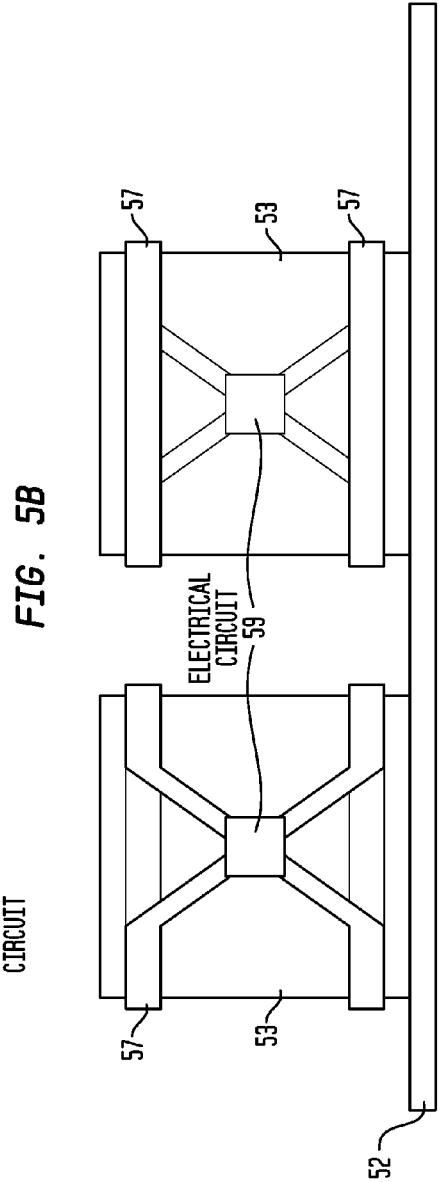
FIG. 5A
FIG. 5B

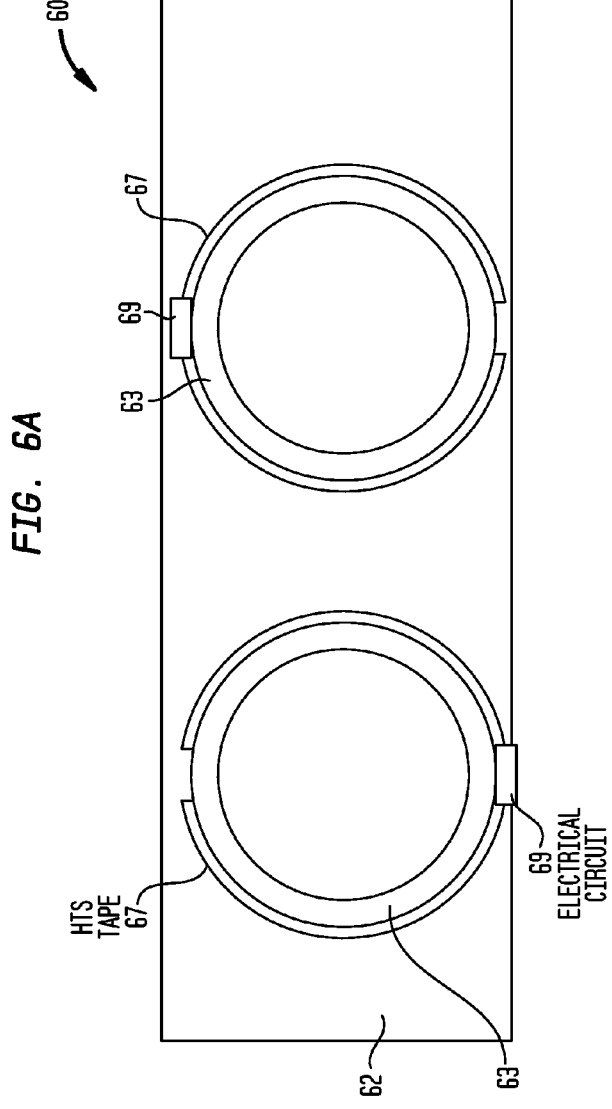
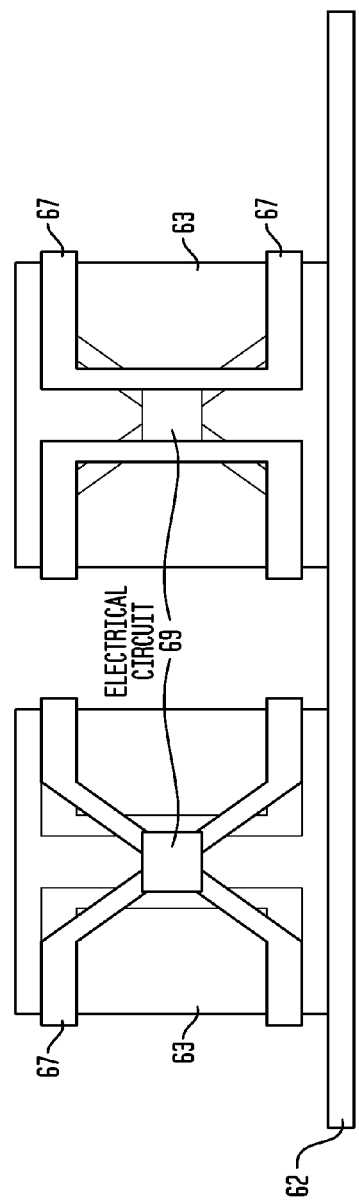

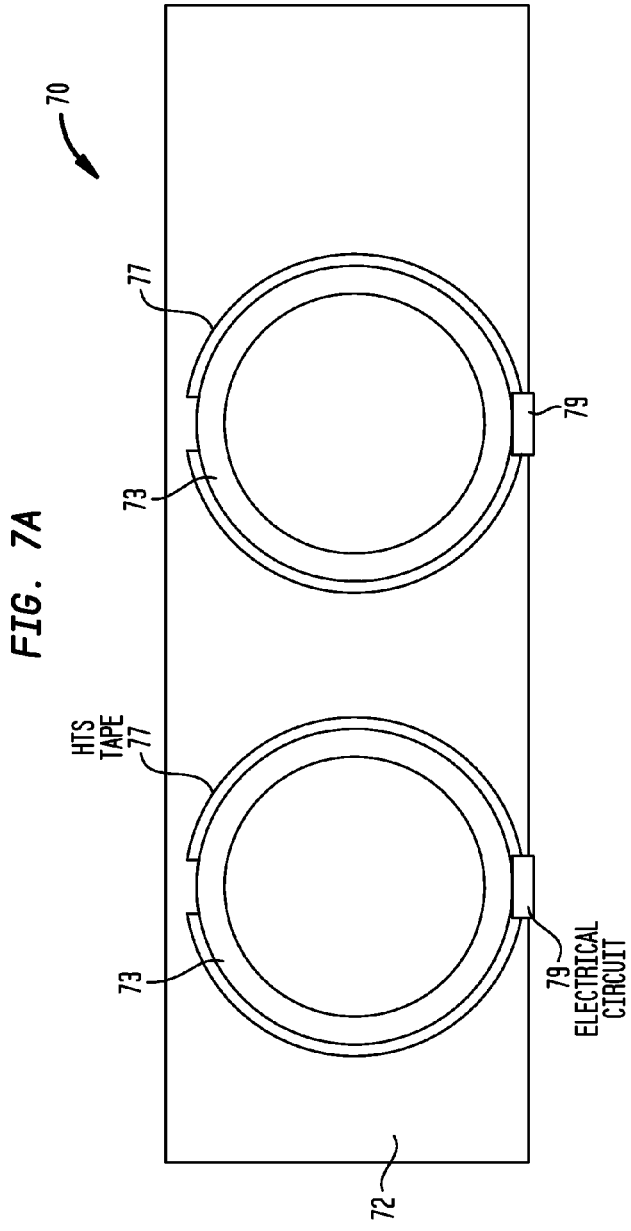
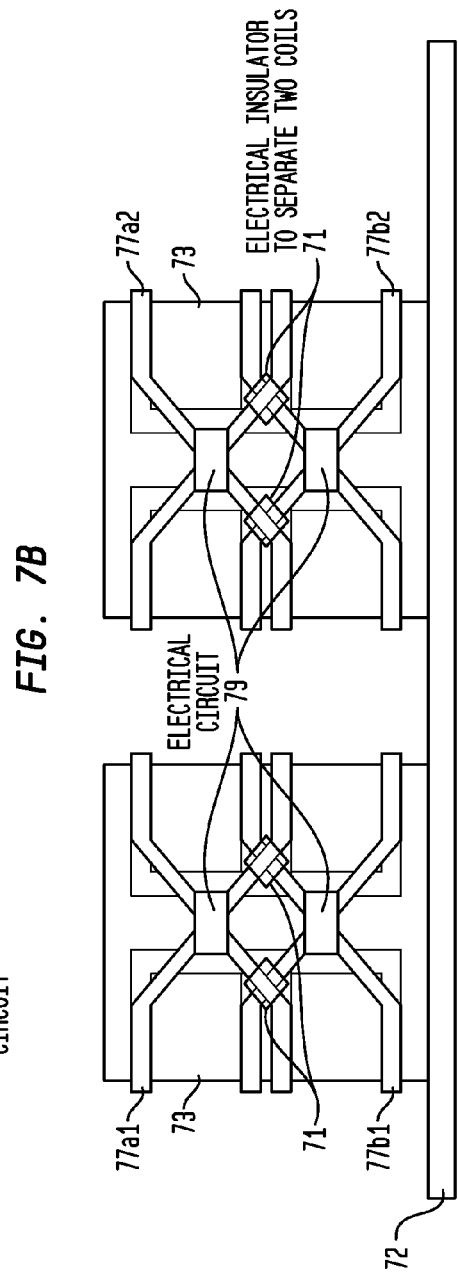

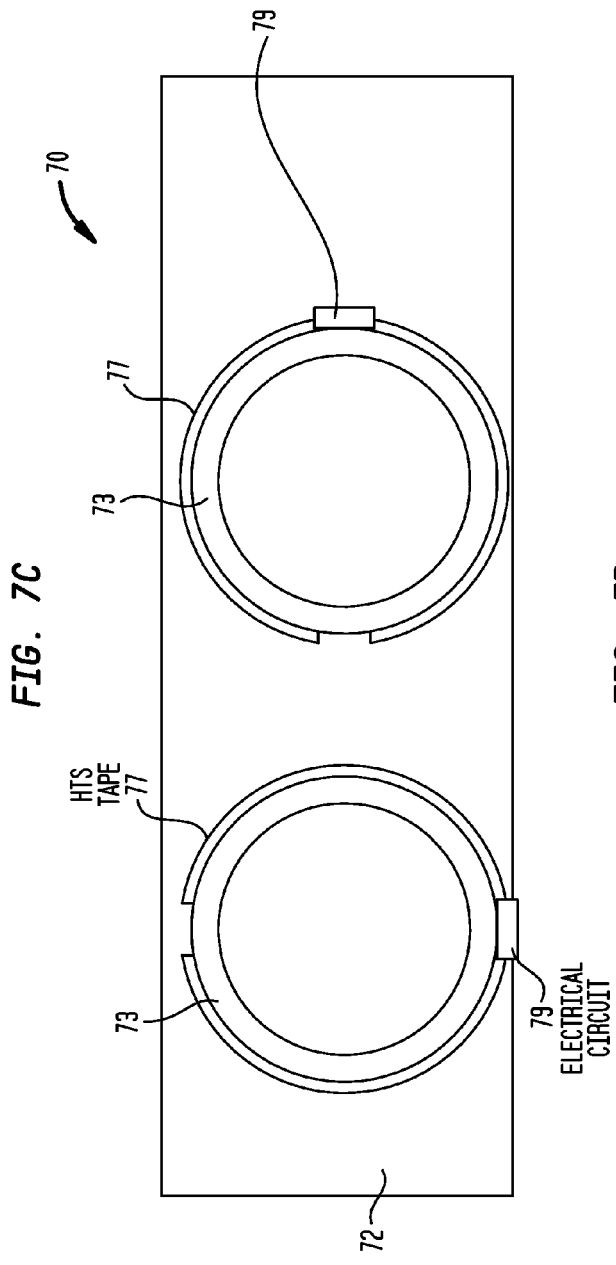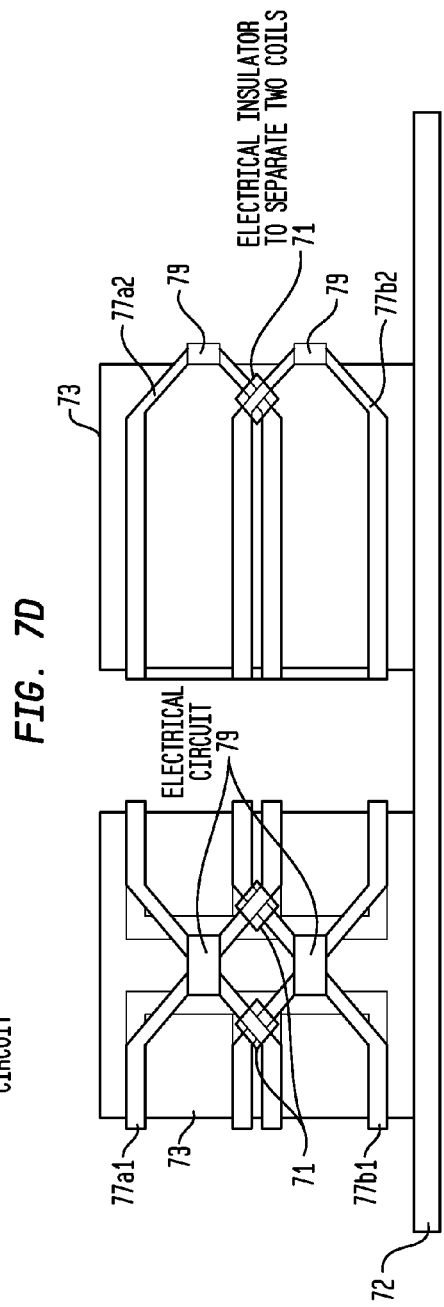

SUPERCONDUCTOR RF COIL ARRAY

RELATED APPLICATIONS

This application claims the benefit of U.S. Provisional Application No. 61/244,132, filed Sep. 21, 2009, which is incorporated herein by reference in its entirety.

TECHNICAL FIELD

The present invention relates generally to magnetic resonance imaging and spectroscopy, and, more particularly, to superconductor coil arrays comprising a plurality of coil elements configured as a surface or volume coil array for receiving signals from and/or transmitting signals to a sample to be examined according to magnetic resonance techniques, and, further, to magnetic resonance imaging and/or spectroscopy apparatus and/or methods employing such a superconductor coil array.

BACKGROUND

Magnetic Resonance Imaging (MRI) technology is commonly used today in larger medical institutions worldwide, and has led to significant and unique benefits in the practice of medicine. While MRI has been developed as a well-established diagnostic tool for imaging structure and anatomy, it has also been developed for imaging functional activities and other biophysical and biochemical characteristics or processes (e.g., blood flow, metabolites/metabolism, diffusion), some of these magnetic resonance (MR) imaging techniques being known as functional MRI, spectroscopic MRI or Magnetic Resonance Spectroscopic Imaging (MRSI), diffusion weighted imaging (DWI), and diffusion tensor imaging (DTI). These magnetic resonance imaging techniques have broad clinical and research applications in addition to their medical diagnostic value for identifying and assessing pathology and determining the state of health of the tissue examined.

During a typical MRI examination, a patient's body (or a sample object) is placed within the examination region and is supported by a patient support in an MRI scanner where a substantially constant and uniform primary (main) magnetic field is provided by a primary (main) magnet. The magnetic field aligns the nuclear magnetization of precessing atoms such as hydrogen (protons) in the body. A gradient coil assembly within the magnet creates a small variation of the magnetic field in a given location, thus providing resonance frequency encoding in the imaging region. A radio frequency (RF) coil is selectively driven under computer control according to a pulse sequence to generate in the patient a temporary oscillating transverse magnetization signal that is detected by the RF coil and that, by computer processing, may be mapped to spatially localized regions of the patient, thus providing an image of the region-of-interest under examination.

In a common MRI configuration, the static main magnetic field is typically produced by a solenoid magnet apparatus, and a patient platform is disposed in the cylindrical space bounded by the solenoid windings (i.e. the main magnet bore). The windings of the main field are typically implemented as a low temperature superconductor (LTS) material, and are super-cooled with liquid helium in order to reduce resistance, and, therefore, to minimize the amount of heat generated and the amount of power necessary to create and maintain the main field. The majority of existing LTS superconducting MRI magnets are made of a niobium-titanium (NbTi) and/or $Nb_3Sn$ material which is cooled with a cryostat to a temperature of 4.2 K.

As is known to those skilled in the art, the magnetic field gradient coils generally are configured to selectively provide linear magnetic field gradients along each of three principal Cartesian axes in space (one of these axes being the direction of the main magnetic field), so that the magnitude of the magnetic field varies with location inside the examination region, and characteristics of the magnetic resonance signals from different locations within the region of interest, such as the frequency and phase of the signals, are encoded according to position within the region (thus providing for spatial localization). Typically, the gradient fields are created by current passing through coiled saddle or solenoid windings, which are affixed to cylinders concentric with and fitted within a larger cylinder containing the windings of the main magnetic field. Unlike the main magnetic field, the coils used to create the gradient fields typically are common room temperature copper windings. The gradient strength and field linearity are of fundamental importance both to the accuracy of the details of the image produced and to the information on tissue chemistry (e.g., in MRSI).

Since MRI's inception, there has been a relentless pursuit for improving MRI quality and capabilities, such as by providing higher spatial resolution, higher spectral resolution (e.g., for MRSI), higher contrast, and faster acquisition speed. For example, increased imaging (acquisition) speed is desired to minimize imaging blurring caused by temporal variations in the imaged region during image acquisition, such as variations due to patient movement, natural anatomical and/or functional movements (e.g., heart beat, respiration, blood flow), and/or natural biochemical variations (e.g., caused by metabolism during MRSI). Similarly, for example, because in spectroscopic MRI the pulse sequence for acquiring data encodes spectral information in addition to spatial information, minimizing the time required for acquiring sufficient spectral and spatial information to provide desired spectral resolution and spatial localization is particularly important for improving the clinical practicality and utility of spectroscopic MRI.

Several factors contribute to better MRI image quality in terms of high contrast, resolution, and acquisition speed. An important parameter impacting image quality and acquisition speed is the signal-to-noise ratio (SNR). Increasing SNR by increasing the signal before the preamplifier of the MRI system is important in terms of increasing the quality of the image. One way to improve SNR is to increase the magnetic field strength of the magnet as the SNR is proportional to the magnitude of the magnetic field. In clinical applications, however, MRI has a ceiling on the field strength of the magnet (the US FDA's current ceiling is 3 T (Tesla)). Other ways of improving the SNR involve, where possible, reducing sample noise by reducing the field-of-view (where possible), decreasing the distance between the sample and the RF coils, and/or reducing RF coil noise.

Despite the relentless efforts and many advancements for improving MRI, there is nevertheless a continuing need for yet further improvements in MRI, such as for providing greater contrast, improved SNR, higher acquisition speeds, higher spatial and temporal resolution, and/or higher spectral resolution.

Additionally, a significant factor affecting further use of MRI technology is the high cost associated with high magnetic field systems, both for purchase and maintenance. Thus, it would be advantageous to provide a high quality MRI imaging system that is capable of being manufactured and/or maintained at reasonable cost, permitting MRI technology to be more widely used.

SUMMARY OF INVENTION

Various embodiments of the present invention provide a superconducting RF coil array which may be used in whole-body MRI scanners and/or in dedicated MRI systems. Some embodiments of the invention provide a superconducting RF coil array for at least one of receiving signals from and transmitting signals to a sample during magnetic resonance analysis of the sample, the superconducting RF coil array comprising a thermally conductive member configured to be cryogenically cooled, and a plurality of coils elements comprising superconducting material, wherein each coil element is thermally coupled to the thermally conductive member and is configured for at least one of (i) receiving a magnetic resonance signal from a spatial region that is contiguous with and/or overlaps a spatial region from which at least one other of the plurality of coil elements is configured to receive a signal and (ii) transmitting a radiofrequency signal to a spatial region that is contiguous with and/or overlaps a spatial region to which at least one other of the plurality coil elements is configured to transmit a radiofrequency signal.

In some embodiments, each coil element may comprise a thin film superconducting coil disposed on a thermally conductive substrate. The thermally conductive substrate may comprise at least one of alumina and sapphire, and the thermally conductive member may be implemented as an alumina or sapphire plate. In various embodiments, the thermally conductive substrate of each coil element may be directly or indirectly thermally coupled to the thermally conductive member. For instance, in some embodiments, a plurality of the thermally conductive substrates are each directly thermally coupled to the thermally conductive member, and each of at least one other of the thermally conductive substrates is indirectly and not directly thermally coupled to said thermally conductive member. Such other thermally conductive substrates may be directly thermally coupled to at least one of the thermally conductive substrates that are directly thermally coupled to the thermally conductive member, such other thermally conductive substrates thereby being indirectly thermally coupled to the thermally conductive member. Thermally conductive spacer members (e.g., standoffs) may alternatively or additionally be used to thermally couple such other thermally conductive substrates to the thermally conductive member, thereby providing indirect thermal coupling between such other thermally conductive substrates and the thermally conductive member.

In some embodiments, one or more of the superconducting coils may comprise a high temperature superconductor, which may be implemented, for example, as a thin film and/or with high temperature superconducting tape. Alternatively or additionally, neighboring superconducting coils may be configured such that they are separate with respect to electrical conductivity and overlap spatially. Such neighboring overlapping coils may be disposed on or above a common surface of the thermally conductive member and/or disposed on opposing surfaces of the thermally conductive member.

In various embodiments, the superconducting RF coil array may be configured as a linear array or a two-dimensional array or a volumetric array. Coils may be implemented as receive-only, transmit-only, or transmit-and-receive.

In some embodiments, each coil element comprises at least one high temperature superconducting coil and a thermally conductive substrate that is thermally coupled to (i) the at least one high temperature superconducting coil and (ii) the thermally conductive member. The thermally conductive substrate may be configured as a generally cylindrical structure having an outer surface upon which at least one superconducting coil is disposed. For example, each thermally conductive substrate may (i) be generally ring-shaped, having a small height relative to diameter, and (ii) have one superconducting coil disposed about the outer surface thereof.

In some embodiments, the superconducting RF coil array may further comprise at least one thermally conductive substrate that is thermally coupled to the thermally conductive member, and wherein each coil element comprises a high temperature superconducting coil. In some such embodiments, each of the at least one thermally conductive substrate may be configured as a generally cylindrical structure having an outer surface upon which at least one of the high temperature superconducting coils is disposed.

In various such implementations, each of the at least one thermally conductive substrate includes at least two of the superconducting coils configured such that neighboring superconducting coils (i) are separate with respect to electrical conductivity and (ii) are displaced and overlap along the axial direction of the cylindrically-shaped thermally conductive substrate. In some of these implementations, the thermally conductive member may be generally planar and the RF coil array may comprise two of the generally cylindrical thermally conductive substrates, each having one axial end thereof thermally coupled to a common surface of the thermally conductive member, and wherein the dimensions of the thermally conductive substrates and their separation are configured to provide the RF coil array as a dedicated breast-imaging RF coil array.

In other various such implementations, the thermally conductive substrate may include at least two of the superconducting coils configured such that neighboring superconducting coils (i) are separate with respect to electrical conductivity and (ii) are displaced and overlap circumferentially about the cylindrically-shaped thermally conductive substrate. The number of circumferentially displaced and overlapping superconducting coils may, for example, be at least four.

In some embodiments, each of the plurality of coil elements may comprise a high temperature superconducting coil, and the thermally conductive member may be configured as a generally cylindrical structure having an outer surface upon which the high temperature superconducting coils are disposed such that neighboring superconducting coils (i) are separate with respect to electrical conductivity and (ii) are displaced and overlap circumferentially about the cylindrically-shaped thermally conductive member.

In various embodiments, at least one of the coil elements may be configured as a multiple resonance radiofrequency coil element operable to receive signals corresponding to different magnetic resonance frequencies at the same magnetic field.

It will be appreciated by those skilled in the art that the foregoing brief description and the following detailed description are exemplary and explanatory of the present invention, but are not intended to be restrictive thereof or limiting of the advantages which can be achieved by this invention. Additionally, it is understood that the foregoing summary of the invention is representative of some embodiments of the invention, and is neither representative nor inclusive of all subject matter and embodiments within the scope of the present invention. Thus, the accompanying drawings, referred to herein and constituting a part hereof, illustrate embodiments of this invention, and, together with the detailed description, serve to explain principles of embodiments of the invention. Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein:

FIGS. 1A and 1B schematically depict a plan view and side view, respectively, of an illustrative superconducting RF coil array comprising generally circular coils, in accordance with some embodiments of the present invention;

FIGS. 2A and 2B schematically depict a plan view and side view, respectively, of an illustrative superconducting RF coil array comprising generally rectangular coils, in accordance with some embodiments of the present invention;

FIGS. 3A, 3B, and 3C schematically illustrate a top view, side view, and oblique view, respectively, of a two-dimensional array of overlapping coil elements, in accordance with some embodiments of the present invention;

FIG. 4A and FIG. 4B schematically depict a plan view and a cross-sectional side view, respectively, of an illustrative superconducting RF coil array which employs high temperature superconductor (HTS) tape for the coils, in accordance with some embodiments of the present invention;

FIG. 5A and FIG. 5B schematically depict a plan view and a side view, respectively, of an illustrative superconducting RF coil array configured for breast imaging in a horizontal main magnetic field, in accordance with some embodiments of the present invention;

FIG. 6A and FIG. 6B schematically depict a plan view and a side view, respectively, of an illustrative superconducting RF coil array configured for breast imaging in a vertical main magnetic field, in accordance with some embodiments of the present invention;

FIG. 7A and FIG. 7B schematically depict a plan view and a side view, respectively, of an illustrative superconducting RF coil array configured for breast imaging in a vertical main magnetic field, in accordance with some embodiments of the present invention;

FIG. 7C and FIG. 7D schematically depict a plan view and a side view, respectively, of an illustrative superconducting RF coil array configured for breast imaging, in accordance with some embodiments of the present invention;

DESCRIPTION OF EMBODIMENTS OF THE INVENTION

Figure 3C:
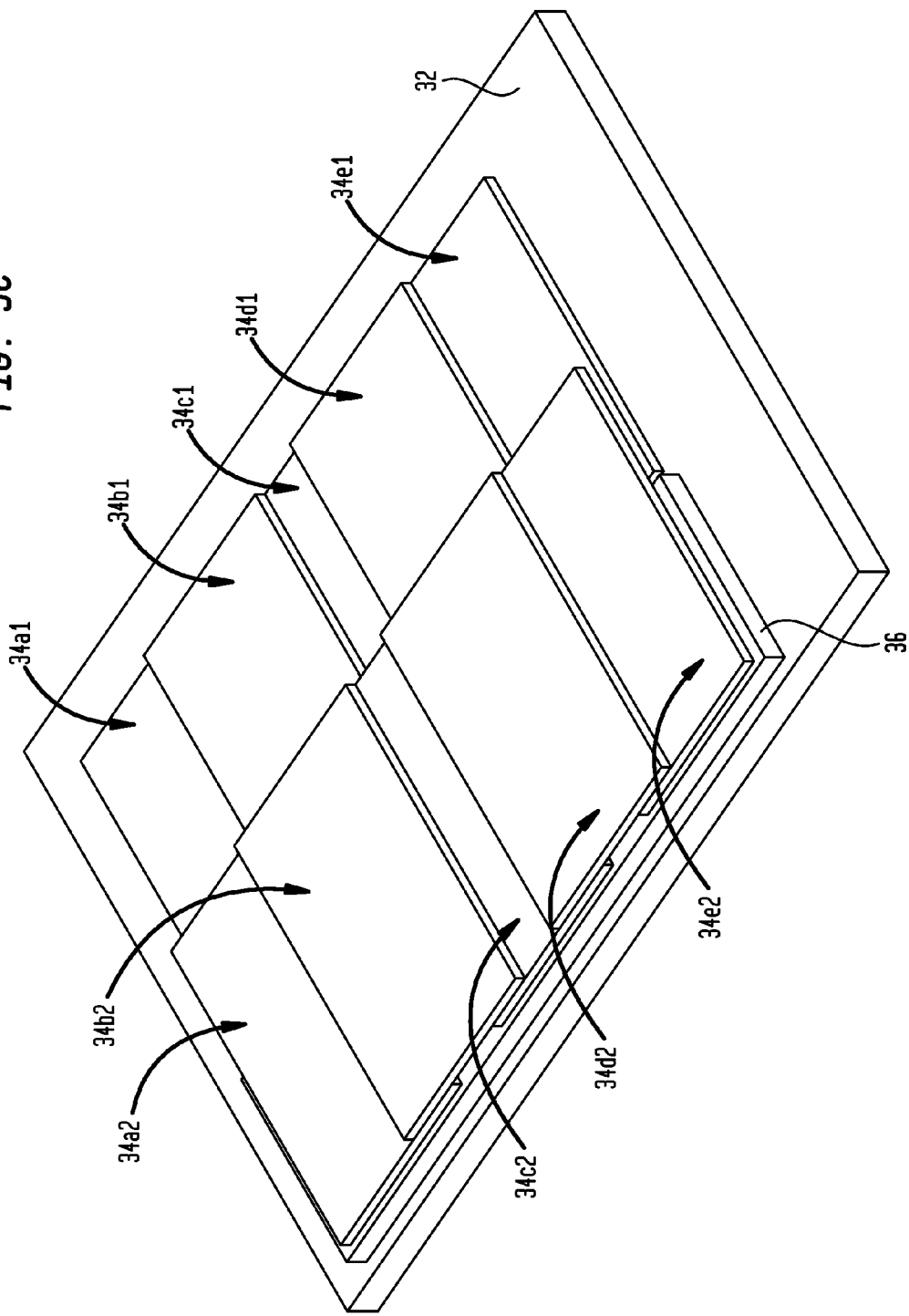

The ensuing description discloses various embodiments of a cryogenically cooled superconducting RF coil array which may be used in whole-body MRI scanners and/or in dedicated MRI systems (e.g., head-dedicated, limb-dedicated, breast-dedicated, pediatric-dedicated, spine-dedicated, etc.). As will be further understood in view of the ensuing description, embodiments of the present invention include surface and volume coil array designs and, in various implementations, two or more superconducting coil array modules (e.g., two or more substantially planar coil array modules, such as one or two dimensional surface coil array modules) such as the herein described embodiments (and variations thereof) may be used together (e.g., by independently positioning them and/or by mounting them in a fixed spatial relationship with respect to each other, such as by mechanically coupling them, directly to each other or via one or more intervening support structures) to essentially form a larger array. For example, two or more superconducting surface coil array modules may be configured to surround an extremity (e.g., thigh, head, etc.) or the torso (e.g., for cardiac imaging) to provide for imaging over a desired region of interest (ROI) (e.g., the desired field of view (FOV)).

As will also be further understood in view of the ensuing description, each superconducting coil array embodiment having a certain general overall geometry (e.g., a substantially planar one (e.g., linear) or two dimensional array, a generally cylindrical array, etc.) may be configured according to various embodiments for any of a variety of applications, such as for whole-body imaging, head-dedicated imaging, extremity-dedicated imaging, pediatric-dedicated imaging, etc.

According to the application for which the coil array may be applied or intended, however, particular design parameters of the coil array of a given general overall geometry may be varied. Such design parameters may include, for example, dimensions of the overall geometric configuration, the dimensions and/or geometry (e.g., circular, square, hexagonal, etc.) and/or number of the coil elements in the array, etc. By way of example, a generally cylindrical array geometry may be applicable for whole-body imaging, head-dedicated imaging, and breast-dedicated imaging; however, if the array is particularly intended for one of these applications, then its design parameters may be determined accordingly (e.g., cylinder length and radius, number and dimensions of coil elements, type of coil elements, spatial arrangement of coil elements about the generally cylindrical geometry, etc.). By way of further example in the context of cylindrical geometries, a cylindrical array intended for head-dedicated applications may be arranged such that the cylindrical structure is open at both ends, whereas for breast-dedicated applications one end of the cylindrical structure may be closed (e.g., allowing for a cryocooler to be disposed adjacent to the closed end).

Similarly, those skilled in the art will understand in view of the ensuing description that the various design parameters and particular configuration of superconducting coil array according to embodiments of the present invention may also vary according to the overall magnetic resonance system in which the coil will be used (e.g., size, open, closed, number of RF channels available, etc., of the MR system).

Additionally, as will be further understood by those skilled in the art in view of the ensuing description, a cryogenically-cooled superconducting RF coil array coil according to various embodiments of the present invention may be implemented in myriad magnetic resonance imaging and spectroscopy systems, such as systems employing conventional copper gradient coils, systems employing superconducting gradient coils (e.g., such as disclosed in U.S. patent application Ser. No. 12/416,606, filed Apr. 1, 2009, and in Provisional Application No. 61/170,135, filed Apr. 17, 2009, each of which is hereby incorporated by reference in its entirety), whole body systems, dedicated head-only systems, systems with a vertically or horizontally oriented main magnetic field, open or closed systems, etc. Similarly, it will also be understood by those skilled in the art that while various portions of the ensuing description may be set forth in the context of an MRI system that may be used for structural examination of a sample (e.g., an individual such as a patient, an animal such as a dog or a rat, a tissue sample, or an other living or non-living object), various embodiments of the present invention may be employed in connection with magnetic resonance (MR) systems operated and/or configured for other modalities, such as functional MRI, diffusion weighted and/or diffusion tensor MRI, MR spectroscopy and/or spectroscopic imaging, etc. Additionally, as used herein, MRI includes and embraces magnetic resonance spectroscopic imaging, diffusion tensor imaging (DTI), as well as any other imaging modality based on nuclear magnetic resonance.

Those skilled in the art will also understand from the ensuing description that superconducting coil arrays according to embodiments of the present invention may be configured or adapted for use as receive-only, or transmit-only, or transmit-and-receive.

FIGS. 1A and 1B schematically depict a plan view (with the contours of underlying features depicted for clarity) and side view, respectively, of an illustrative superconducting RF coil array 10, in accordance with some embodiments of the present invention. More specifically, FIGS. 1A and 1B illustrate a configuration of five superconducting RF coil elements 14a-14e (also referred to herein as coils 14a-14e, and collectively as superconductor RF coil elements 14 or coils 14) arranged in two layers to provide a linear array.

As shown, coil elements 14a, 14c, and 14e (referred to, collectively, for convenience as the "lower coil elements") are each disposed in direct thermal contact with a heat conducting substrate (plate) 12, and coil elements 14b and 14d (referred to, collectively, for convenience as the "upper coil elements") are disposed above the lower coil elements and are thermally coupled to the lower coil elements and to the plate 12 via standoffs 16a and 16b (referred to collectively as standoffs 16), respectively. Epoxy and/or thermal grease/compound (which are not shown) may be provided between the coils 14 and plate 12 and/or standoffs 16 to provide thermal and mechanical contact therebetween.

Heat conducting plate 12 and each heat conducting standoff 16 may be formed, for example, of any of one or more high thermal conductivity materials, such as sapphire or alumina, or other non-metallic high thermal conductivity material, such as high thermal conductivity ceramic. As further described hereinbelow, heat conducting plate 12 is thermally coupled (not shown herein) to a cryogenic cooling system, and superconducting coil array 10 is enclosed within a housing that maintains array 10 within a vacuum (e.g., at least a low vacuum). In various alternative embodiments, heat conducting plate 12 may be narrower than the diameter of the coil elements and, in some embodiments, plate 12 may be implemented as two separate, parallel elongated members that each contact a backside portion of coil elements 14a, 14c, 14e.

In FIGS. 1A and 1B, each coil element 14 comprises a substrate 15 (e.g., a sapphire wafer) and a thin film superconducting coil 17 (also referred to as a trace 17). In the embodiment of FIGS. 1A and 1B, thin film traces 17 are formed on the upper surface (facing away from plate 12) of substrates 15, though in various alternative embodiments the traces may be disposed on the lower surface (facing plate 12) of substrates 15.

More particularly, in accordance with some embodiments of the present invention, the trace 17 of each RF coil element 14a-14e may be implemented as a high temperature superconductor (HTS), such as YBCO and/or BSCCO, etc. (e.g., using an HTS thin film or HTS tape), though a low temperature superconductor (LTS) may be used in various embodiments. For example, in some embodiments, each of RF coil elements 14a-14e is an HTS thin film spiral coil and/or an HTS thin film spiral-interdigitated coil on a substrate such as sapphire or lanthanum aluminate. The design and fabrication of such coils is further described in and/or may be further understood in view of, for example, Ma et al., "Superconducting RF Coils for Clinical MR Imaging at Low Field," Academic Radiology, vol. 10, no. 9, September 2003, pp. 978-987; Gao et al., "Simulation of the Sensitivity of HTS Coil and Coil Array for Head Imaging," ISMRM-2003, no. 1412; Fang et al., "Design of Superconducting MRI Surface Coil by Using Method of Moment," IEEE Trans. on Applied Superconductivity, vol. 12, no. 2, pp. 1823-1827 (2002); and Miller et al., "Performance of a High Temperature Superconducting Probe for In Vivo Microscopy at 2.0 T," Magnetic Resonance in Medicine, 41:72-79 (1999), each of which is incorporated by reference herein in its entirety. Accordingly, in some embodiments, superconducting RF coil array 10 is implemented as an HTS thin film RF coil array.

The design of each coil element (e.g., trace diameter, number of turns) may depend on the application, and may include considerations of homogeneity, signal-to-noise ratio, and field of view (FOV). Similar considerations may factor into determining the number of coil elements that will be employed (e.g., while five coil elements are shown in the embodiment of FIGS. 1A and 1B, a linear array may include fewer or more coil elements). As depicted in FIGS. 1A and 1B, the traces 17 of neighboring coil elements 14 overlap, with this overlap being provided by vertically displacing neighboring coil elements. Those skilled in the art will understand that the amount of overlap between neighboring coils may be optimized with respect to decoupling.

As indicated, standoffs 16 may assist in thermal conduction (e.g., between upper coils and plate 12) and in mechanical support (e.g., assisting support of the upper coils). Using standoffs 16a disposed over the traces of the lower coil elements may also assist in preventing damage that may occur to these traces if the upper coil elements directly contacted the lower coil elements. In various embodiments, standoffs 16a may include a narrow recessed region that is disposed over the underlying trace of the lower coil elements such that the lower trace is not mechanically contacted by the overlying standoff 16a.

It will be understood that in various alternative embodiments, one or more (e.g., all) of the standoffs 16 may be eliminated. For example, some embodiments may include the standoffs 16a between lower and upper coil elements while not employing standoffs 16b between plate 12 and upper coil elements 14b, 14d, as the inter-coil element standoffs 16a may provide sufficient thermal conduction for cooling the upper coil elements. Additionally or alternatively, various embodiments may include an additional high thermal conductivity plate in direct contact with upper coil elements 14b and 14d.

By way of non-limiting example, for illustrative purposes, in some embodiments, plate 12 may have a thickness of about 3-5 mm, each coil element trace 17 may have a diameter of about 1 cm to about 10 cm or greater, each coil element substrate 15 may have a thickness of about 0.3 mm to about 0.6 mm, and standoffs 16a may have a thickness of about 0.1 mm to about 0.5 mm.

While not shown in FIGS. 1A and 1B, an electronics module for each coil element may be disposed on plate 12 and/or substrates 15, and may include at least a preamplifier, and may also include additional circuitry, such as for impedance matching, decoupling, etc.

As indicated above, superconducting RF coil array 10 depicted in FIGS. 1A and 1B is disposed in a vacuum chamber and is cooled by plate 12 being thermally coupled with a cryogenic cooling system. In various embodiments, the coils elements 14a-14e may be cooled to a temperature in the range of about 4K to 100K, and more particularly, to a temperature below the critical temperature of the superconducting material (e.g., in some embodiments, below the critical temperature of a high temperature superconductor (HTS) material used for the RF coils 17). In various embodiments, the cryogenic cooling system may comprise a cryocooler implemented as any of various single stage or multi-stage cryocoolers, such as, for example, a Gifford McMahon (GM) cryocooler, a pulse tube (PT) cooler, a Joule-Thomson (JT) cooler, a Stirling cooler, or other cryocooler. In various alternative embodiments, the superconductor RF coil array 10 may be configured for cooling such that coils 17 are cooled by a cryogen, such as liquid helium and liquid nitrogen.

While not shown herein, the vacuum chamber may be implemented, for example, as a double-walled Dewar structure. More specifically, in accordance with some embodiments of the present invention, the vacuum chamber may comprise a double-walled Dewar made of glass and/or other non-conductive, mechanically strong material(s), such as G10, RF4, plastic, and/or ceramic. In various embodiments, a double-walled Dewar may be implemented in accordance with, or similar to, the hermetically sealed double-walled structures (and vacuum thermal isolation housing) described in U.S. application Ser. No. 12/212,122, filed Sep. 17, 2008, in U.S. application Ser. No. 12/212,147, filed Sep. 17, 2008, and in U.S. Provisional application Ser. No. 61/171,074, filed Apr. 20, 2009, each of which is herein incorporated by reference in its entirety. While not discussed in detail hereinbelow, it will be understood that the embodiments presented below are also implemented within a vacuum chamber and are thermally coupled for cryogenic cooling.

It will be understood that two or more linear arrays such as, or in accordance with, the linear array depicted in FIGS. 1A and 1B may be combined to provide a two or three dimensional array assembly. For example, in some embodiments, eight linear arrays (e.g., each having two or more linearly arranged coil elements) may be assembled into a generally cylindrical, octagonal arrangement, with each linear array extending longitudinally, and azimuthally displaced by about 45 degrees. Such a configuration may be implemented similarly to embodiments of the superconductor RF head coil array disclosed in Provisional Application No. 61/171,074, filed Apr. 20, 2009, which is herein incorporated by reference in its entirety.

As understood in view of the foregoing description, in accordance with various embodiments of the present invention, superconducting RF coil array 10 may be implemented as a receive-only array, with an RF transmitter being implemented as a separate RF coil (not shown), which in various embodiments may be a conventional (e.g., non-superconducting, such as a conventional copper RF coil) RF transmitter coil or a superconducting RF transmitting coil. In some embodiments, superconducting RF coil array 10 may be implemented as a transmit and receive coil array (a transceiver array), with each superconducting RF coil element 14 being used for both transmission and reception of RF signals.

In accordance with various embodiments of the present invention, one or more of the superconducting RF coil elements 14 may be implemented as a multiple resonance RF coil element (e.g., comprising two or more receiving coils having different resonant frequencies, such as for detecting sodium and hydrogen resonances at a given magnetic field (e.g., at 3 Tesla (T)).

Referring now to FIGS. 2A and 2B, shown are a plan view (with the contours of underlying features depicted for clarity) and side view, respectively, of an illustrative superconducting RF coil array 20, in accordance with some embodiments of the present invention. More specifically, FIGS. 2A and 2B illustrate a configuration of five superconducting RF coil elements 24a-24e (referred to herein collectively as superconductor RF coil elements 24 or coils 24) arranged in two layers to provide a linear array, similar to the linear array of FIGS. 1A and 1B, formed on a heat conducting plate 22. Compared to the linear array of FIGS. 1A and 1B, the linear array of FIGS. 2A and 2B includes substantially rectangular (thin film HTS) traces 27 and substantially rectangular substrates 25. Rectangular substrates 25 may be formed by cutting or scribing a circular substrate, such as a circular sapphire or alumina substrate. Rectangular shaped traces may provide for improved image reconstruction due to the substantially constant trace overlap distance. Rectangular coil elements may also be better suited than circular coil elements for forming two-dimensional arrays.

For example, FIGS. 3A-3C illustrate a two-dimensional (2×5) rectangular array 30 of substantially rectangular coil elements 34a1, 34b1 . . . 34e1, 34a2, 34b2 . . . 34e2, having substantially rectangular substrates and substantially rectangular traces 37, assembled in four layers using a standoff element 36 directly coupled between heat conducting plate 32 and the coil elements of the second uppermost layer (comprising elements 34a2, 34c2, and 34e2), thereby providing thermal conduction and mechanical support for the elements of the second uppermost layer and those of the overlying uppermost layer (comprising elements 34b2, 34d2). More specifically, FIG. 3A is a top view (with the contours of underlying features depicted for clarity), FIG. 3B is a side view, and FIG. 3C is an oblique view (with the contours of underlying features depicted for clarity). As shown, the traces 37 of each adjacent coil element overlap each other (i.e., a coil element trace overlaps the traces of its nearest neighbors and next-nearest neighbors (i.e., diagonally disposed neighbors). It will be understood that in various implementations, standoff disk elements may also be included to directly couple elements of the lowermost layer (comprising elements 34a1, 34c1, 34e1) and elements of the second uppermost layer (comprising elements 34a2, 34c2, and 34e2) in regions where the lowermost layer elements and second uppermost layer elements overlap. It will also be understood that rather than employing an elongated standoff element 36, separate standoff disks may be disposed between plate 32 and each of coil elements 34a2, 34c2, and 34e2. Those skilled in the art will understand that such a four-layer construction as depicted in the embodiment of FIGS. 3A-3C may be used to provide a two-dimensional array of overlapping coil elements of arbitrary dimension (e.g., 3×5, 4×5, 4×8, 8×8, etc.).

Referring now to FIG. 4A and FIG. 4B, shown are a plan view (with the contours of underlying features depicted for clarity) and a cross-sectional side view (sectioned along the diameter of coil elements), respectively, of an illustrative superconducting RF coil array 40 which employs high temperature superconductor (HTS) tape for the coils, in accordance with some embodiments of the present invention. As shown, array 40 comprises three linearly arranged coil elements 44a, 44b, 44c, alternately disposed on opposite surfaces of heat conducting plate 42. Each coil element comprises a thermally conductive (e.g., alumina) supporting ring 43, an HTS coil 47, and an electrical circuit 49. As shown, thermally conductive (e.g., alumina) supporting ring 43 is thermally coupled to heat conducting (e.g., alumina or sapphire) plate 42, and HTS tape 47 is wrapped circumferentially around alumina supporting ring 43 and may be fixed in place by attachment (e.g., soldering) of electrical circuit 49. Epoxy and/or thermal grease may also be used to thermally couple and affix tape 47 to the circumferential surface of supporting ring 43. Electrical circuit 49 may include at least a preamplifier, and may also include additional circuitry, such as for impedance matching, decoupling, etc. By way of non-limiting example, for purposes of illustration, ring 43 may have a diameter between about 2.5 cm to about 25 cm or greater, and may have a height (along cylindrical axis) of about 5 mm to about 25 mm; HTS tape 47 may have a thickness of about 0.1 mm to about 0.5 mm and a width of about 5 mm to about 13 mm and may be wrapped a single loop around alumina ring 43.

Referring now to FIG. 5A and FIG. 5B, shown are a plan view (with the contours of underlying features depicted for clarity) and a side view, respectively, of an illustrative superconducting RF coil array 50 which employs high temperature superconductor (HTS) tape for the coils and is configured for breast imaging in a horizontal main magnetic field (i.e., orthogonal to the longitudinal axis of the generally cylindrically shaped coil elements), in accordance with some embodiments of the present invention. The construction of coil array 50 is similar to coil array 40 at least insofar as the coil elements are implemented as HTS tape mounted about a generally cylindrical thermally conductive (e.g., alumina) support ring which is thermally coupled to a heat conducting plate. More specifically, as shown, each generally cylindrical coil element of array 50 comprises a thermally conductive (e.g., alumina) supporting ring 53, an HTS coil 57, and an electrical circuit 59. As shown, thermally conductive (e.g., alumina) supporting ring 53 is thermally coupled to heat conducting (e.g., alumina or sapphire) plate 52, and HTS tape 57 is wrapped circumferentially around alumina supporting ring 53 in a coil configuration for use with a horizontal magnetic field, and may be fixed in place by attachment (e.g., soldering) of electrical circuit 59. Epoxy and/or thermal grease may also be used to thermally couple and affix tape 57 to the circumferential surface of supporting ring 53. Electrical circuit 59 may include at least a preamplifier, and may also include additional circuitry, such as for impedance matching, decoupling, etc. By way of non-limiting example, for purposes of illustration, ring 43 may have a diameter of about 15 cm to about 25 cm or greater, and may have a height (along cylindrical axis) of about 15 cm to about 25 cm or greater.

Referring now to FIG. 6A and FIG. 6B, shown are a plan view (with the contours of underlying features depicted for clarity) and a side view, respectively, of an illustrative superconducting RF coil array 60 which employs high temperature superconductor (HTS) tape for the coils and is configured for breast imaging in a vertical main magnetic field (i.e., parallel to the longitudinal axis of the generally cylindrically shaped coil elements), in accordance with some embodiments of the present invention. As shown, each generally cylindrical coil element of array 60 comprises a thermally conductive (e.g., alumina) supporting ring 63, an HTS coil 67, and an electrical circuit 69, and the thermally conductive (e.g., alumina) supporting ring 63 is thermally coupled to heat conducting (e.g., alumina or sapphire) plate 62. The construction of coil array 60 is similar to coil array 50; however, HTS coils 67 are wound in a configuration suitable for use in a vertical field (e.g., a saddle coil configuration).

Referring now to FIG. 7A and FIG. 7B, shown are a plan view (with the contours of underlying features depicted for clarity) and a side view, respectively, of an illustrative superconducting RF coil array 70 which employs high temperature superconductor (HTS) tape for the coils and is configured for breast imaging in a vertical main magnetic field (i.e., parallel to the longitudinal axis of the generally cylindrically shaped coil elements), in accordance with some embodiments of the present invention. As shown, each generally cylindrical coil element of array 70 comprises a thermally conductive (e.g., alumina) supporting ring 73, HTS tape 77, and an electrical circuit 79, and the thermally conductive (e.g., alumina) supporting ring 73 is thermally coupled to heat conducting (e.g., alumina or sapphire) plate 72. The construction of coil array 70 is similar to coil array 60; however, the HTS tape 77 associated with each supporting ring is implemented as two overlapping coils to provide a coil array for each generally cylindrical element. More specifically, as shown, overlapping HTS coils 77a1 (upper) and 77b1 (lower) are wound on one common supporting ring 73, and overlapping HTS coils 77a2 (upper) and 77b2 (lower) are wound on the other common supporting ring 73, with each coil 77a1, 77b1, 77a2, 77b2 wound in a configuration suitable for use in a vertical field (e.g., a saddle coil configuration). Electrical insulators 71 are disposed where the upper and lower coils overlap to separate the overlapping upper and lower coils. The coil group 77a1/77b1 and group 77a2/77b2 can be arranged such that their respective associated fields (B1 field) are orthogonal with each other to minimize the coupling between them, as shown in FIG. 7C and FIG. 7D.

Figure 8A:
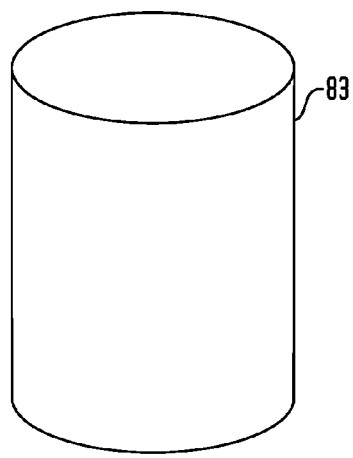
FIGS. 8A and 8B schematically depict an HTS tape coil array comprising a generally cylindrical thermally conductive support and circumferentially disposed overlapping HTS coils, in accordance with some embodiments of the present invention.
Figure 8B:
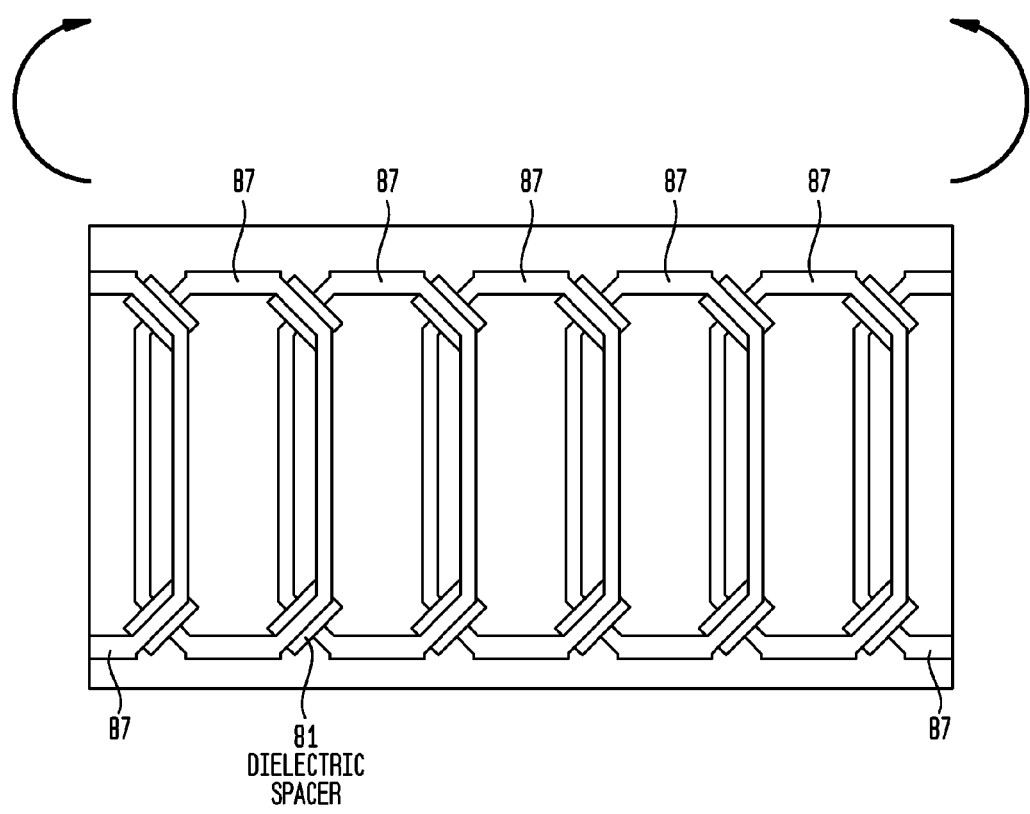

FIGS. 8A and 8B schematically depict an HTS tape coil array comprising a generally cylindrical thermally conductive support (e.g., alumina tube) 83 and HTS coils (87) implemented as HTS tape and formed on the alumina tube directly or through a thin plastic sheet, in accordance with some embodiments of the present invention. More specifically, FIG. 8B depicts the overlapping six element coil array configuration that is circumferentially disposed about support 83. As noted, high temperature superconductor (HTS) tape is used for the coils, in accordance with various embodiments. Additionally, as shown, electrical insulators (dielectric spacers) 81 are disposed where the coils overlap to separate the overlapping coils.

Figure 9A:
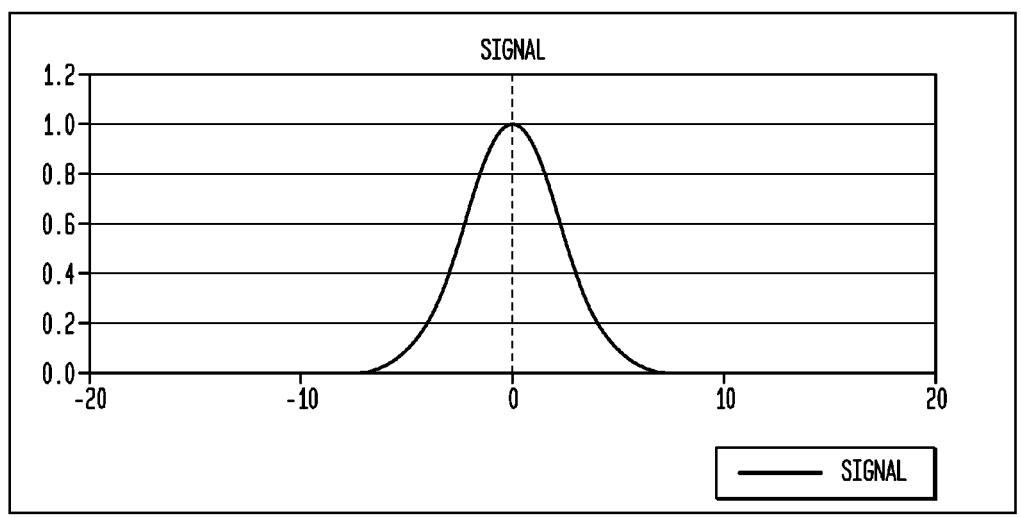
FIGS. 9A and 9B show simulated results of the RF signal profile associated with one HTS coil (FIG. 9B) and with a linear array of five overlapping HTS coils according to some embodiments of the present invention.
Figure 9B:
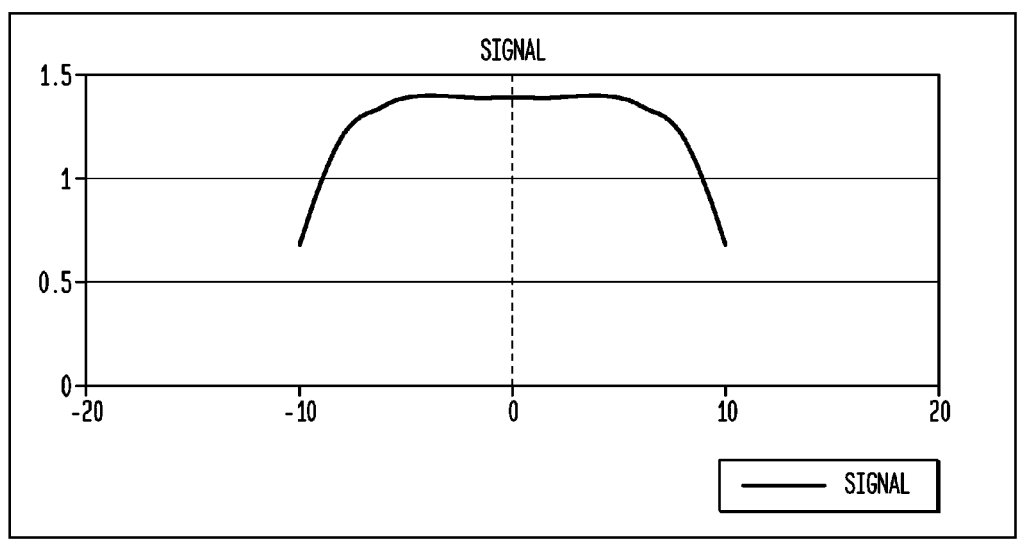

FIGS. 9A and 9B show simulated results of the RF signal profile associated with one HTS coil (FIG. 9A) and with a linear array of five overlapping HTS coils, illustrating the uniformity that may be provided by such arrays.

Additionally, as indicated above, it is understood that according to some embodiments of the present invention, a cryogenically-cooled superconducting RF coil array coil according to various embodiments of the present invention may be implemented in a magnetic resonance imaging system that employs superconducting gradient coils such as those disclosed in U.S. patent application Ser. No. 12/416,606, filed Apr. 1, 2009, and in Provisional Application No. 61/170,135, filed Apr. 17, 2009, each of which is hereby incorporated by reference in its entirety.

The present invention has been illustrated and described with respect to specific embodiments thereof, which embodiments are merely illustrative of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. A superconducting RF coil array for at least one of receiving signals from and transmitting signals to a sample during magnetic resonance analysis of the sample, the superconducting RF coil array comprising:
   a thermally conductive member configured to be cryogenically cooled; and
   a plurality of coils elements comprising superconducting material, wherein each coil element is thermally coupled to said thermally conductive member and is configured to provide a respective electrical channel for at least one of (i) receiving a magnetic resonance signal from a spatial region that is contiguous with and/or overlaps a spatial region from which at least one other of the plurality of coil elements is configured to receive a signal and (ii) transmitting a radiofrequency signal to a spatial region that is contiguous with and/or overlaps a spatial region to which at least one other of the plurality coil elements is configured to transmit a radiofrequency signal.

2. The superconducting RF coil array according to claim 1, wherein each coil element comprises a thin film superconducting coil disposed on a thermally conductive substrate.

3. The superconducting RF coil array according to claim 2, wherein the thermally conductive substrate comprises at least one of alumina and sapphire, and said thermally conductive member is an alumina or sapphire plate.

4. The superconducting RF coil array according to claim 2, wherein the thermally conductive substrate of each coil element is directly or indirectly thermally coupled to said thermally conductive member.

5. The superconducting RF coil array according to claim 4, wherein a plurality of the thermally conductive substrates are each directly thermally coupled to said thermally conductive member, and each of at least one other of said thermally conductive substrates is indirectly and not directly thermally coupled to said thermally conductive member.

6. The superconducting RF coil array according to claim 5, wherein each of said at least one other thermally conductive substrates is directly thermally coupled to at least one of the thermally conductive substrates that are directly thermally coupled to said thermally conductive member, thereby being indirectly thermally coupled to said thermally conductive member.

7. The superconducting RF coil array according to claim 5, wherein one or more of said at least one other thermally conductive substrates is thermally coupled to said thermally conductive member via a thermally conductive spacer member, thereby being indirectly thermally coupled to said thermally conductive member.

8. The superconducting RF coil array according to claim 2, wherein each of the thin film superconducting coils comprises a high temperature superconductor.

9. The superconducting RF coil array according to claim 1, wherein each of the coil elements comprises a high temperature superconducting coil, and the high temperature superconducting coils of neighboring coil elements are separate with respect to electrical conductivity and partially overlap spatially.

10. The superconducting RF coil array according to claim 9, wherein the superconducting coils of neighboring coil elements are disposed on or above a common surface of the thermally conductive member.

11. The superconducting RF coil array according to claim 9, wherein the superconducting coils of neighboring coil elements are disposed on or above opposing surfaces of the thermally conductive member.

12. The superconducting RF coil array according to claim 1, wherein the coil elements are configured as a linear array.

13. The superconducting RF coil array according to claim 1, wherein the coil elements are configured as a two-dimensional array.

14. The superconducting RF coil array according to claim 1, wherein the coil elements are configured as receive-only coils.

15. The superconducting RF coil array according to claim 1, wherein each coil element comprises at least one high temperature superconducting coil and a thermally conductive substrate that is thermally coupled to (i) the at least one high temperature superconducting coil and (ii) said thermally conductive member.

16. The superconducting RF coil array according to claim 15, wherein the thermally conductive substrate is configured as a generally cylindrical structure having an outer surface upon which at least one superconducting coil is disposed.

17. The superconducting RF coil array according to claim 16, wherein each thermally conductive substrate (i) is generally ring-shaped, having a small height relative to diameter, and (ii) has one superconducting coil disposed about the outer surface thereof.

18. The superconducting RF coil array according to claim 1, further comprising at least one thermally conductive substrate that is thermally coupled to said thermally conductive member, and wherein each coil element comprises a high temperature superconducting coil.

19. The superconducting RF coil array according to claim 18, wherein each of the at least one thermally conductive substrate is configured as a generally cylindrical structure having an outer surface upon which at least one of said high temperature superconducting coils is disposed.

20. The superconducting RF coil array according to claim 19, wherein each of the at least one thermally conductive substrate includes at least two said superconducting coils configured such that neighboring superconducting coils (i) are separate with respect to electrical conductivity and (ii) are displaced and partially overlap along the axial direction of the cylindrically-shaped thermally conductive substrate.

21. The superconducting RF coil array according to claim 20, wherein said thermally conductive member is generally planar and the RF coil array comprises two of said thermally conductive substrates, each having one axial end thereof thermally coupled to a common surface of said thermally conductive member, and wherein the dimensions of the thermally conductive substrates and their separation are configured to provide the RF coil array as a dedicated breast-imaging RF coil array.

22. The superconducting RF coil array according to claim 19, wherein the thermally conductive substrate includes at least two said superconducting coils configured such that neighboring superconducting coils (i) are separate with respect to electrical conductivity and (ii) are displaced and overlap circumferentially about the cylindrically-shaped thermally conductive substrate.

23. The superconducting RF coil array according to claim 22, wherein the number of said superconducting coils is at least four.

24. The superconducting RF coil array according to claim 18, wherein at least one of the coil elements comprises superconducting tape.

25. The superconducting RF coil array according to claim 1, wherein each coil element comprises superconducting tape coil disposed on a thermally conductive substrate.

26. The superconducting RF coil array according to claim 1, wherein each coil element comprises a high temperature superconducting coil, and wherein the thermally conductive member is configured as a generally cylindrical structure having an outer surface upon which said high temperature superconducting coils are disposed such that neighboring superconducting coils (i) are separate with respect to electrical conductivity and (ii) are displaced and overlap circumferentially about the cylindrically-shaped thermally conductive member.

27. The superconducting RF coil array according to claim 1, wherein at least one of the coil elements is configured as a multiple resonance radiofrequency coil element operable to receive signals corresponding to different magnetic resonance frequencies at the same magnetic field.

28. A superconducting RF coil array for receiving signals from a sample during magnetic resonance analysis of the sample, the superconducting RF coil array comprising:
a thermally conductive member configured to be cryogenically cooled; and
a plurality of coils elements comprising superconducting material, wherein each coil element is thermally coupled to said thermally conductive member and is configured to provide a respective electrical channel for receiving a magnetic resonance signal from a spatial region that is contiguous with and/or overlaps a spatial region from which at least one other of the plurality of coil elements is configured to receive a signal.

* * * * *